(12) United States Patent
Schrader et al.

(10) Patent No.: US 9,964,603 B2
(45) Date of Patent: May 8, 2018

(54) TOOL FOR THE PRIMARY SHAPING OF A HOUSING FOR A SENSOR

(71) Applicant: Continental Teves AG & Co. oHG, Frankfurt (DE)

(72) Inventors: Ulrich Schrader, Wöllstadt (DE); Manfred Goll, Glauburg (DE); Lothar Biebricher, Oberursel (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 0 days. days.

(21) Appl. No.: 15/034,582

(22) PCT Filed: Oct. 8, 2014

(86) PCT No.: PCT/EP2014/071589
§ 371 (c)(1),
(2) Date: May 5, 2016

(87) PCT Pub. No.: WO2015/078628
PCT Pub. Date: Jun. 4, 2015

(65) Prior Publication Data
US 2016/0282422 A1    Sep. 29, 2016

(30) Foreign Application Priority Data
Nov. 28, 2013  (DE) .......... 10 2013 224 466

(51) Int. Cl.
*G01R 33/00*    (2006.01)
*B29C 45/16*    (2006.01)
(Continued)

(52) U.S. Cl.
CPC ........ *G01R 33/0052* (2013.01); *B29C 39/021* (2013.01); *B29C 39/04* (2013.01);
(Continued)

(58) Field of Classification Search
CPC ............ G01D 11/245; B29C 45/14639; G01R 33/0005
See application file for complete search history.

(56) References Cited

U.S. PATENT DOCUMENTS 5,137,677 A * 8/1992 Murata ............. B29C 45/14639
264/272.16
6,131,267 A * 10/2000 Van Den Berg ...... B29C 33/123
264/272.15
(Continued)

FOREIGN PATENT DOCUMENTS

DE        10146949       6/2002
DE        10118296 A1    11/2002
(Continued)

OTHER PUBLICATIONS

German Search Report for German Application No. 10 2013 224 466.5 dated Jul. 9, 2014, including partial translation.
(Continued)

*Primary Examiner* — Tung X Nguyen
*Assistant Examiner* — Adam Clarke
(74) *Attorney, Agent, or Firm* — RatnerPrestia

(57) ABSTRACT

A tool for the primary shaping of a housing for a sensor which is designed to capture, via a sensing element, a physical area that is dependent on a variable to be measured, and to emit an electrical output signal on the basis of the captured physical area, including: —a mold cavity for receiving a material that molds the housing, and the sensing element, and —a box having a wall that bounds the mold cavity, wherein at least a part of the wall that bounds the mold cavity is mounted in a displaceable manner.

6 Claims, 8 Drawing Sheets

(51) Int. Cl.
  *G01D 11/24* (2006.01)
  *B29C 39/02* (2006.01)
  *B29C 39/04* (2006.01)
  *B29C 39/10* (2006.01)
  *B29C 39/38* (2006.01)
  *B29C 45/00* (2006.01)
  *B29C 45/14* (2006.01)
  *B29C 45/26* (2006.01)
  *B29L 31/34* (2006.01)
  *B29C 45/17* (2006.01)
  *B29K 101/12* (2006.01)

(52) U.S. Cl.
  CPC .............. *B29C 39/10* (2013.01); *B29C 39/38* (2013.01); *B29C 45/0025* (2013.01); *B29C 45/14* (2013.01); *B29C 45/1635* (2013.01); *B29C 45/26* (2013.01); *G01D 11/245* (2013.01); *G01R 33/0047* (2013.01); *B29C 2045/1785* (2013.01); *B29K 2101/12* (2013.01); *B29L 2031/3481* (2013.01)

(56) References Cited

U.S. PATENT DOCUMENTS

| | | | |
|---|---|---|---|
| 7,233,141 B2 | 6/2007 | Fouquet | |
| 8,623,254 B2 | 1/2014 | Goetz | |
| 8,820,160 B2 | 9/2014 | Doering | |
| 9,014,921 B2 | 4/2015 | Bretzigheimer | |
| 2005/0115317 A1* | 6/2005 | Fouquet | B29C 45/1671 |
| | | | 73/494 |
| 2005/0161866 A1* | 7/2005 | Batlaw | B29B 11/08 |
| | | | 264/537 |
| 2007/0187869 A1 | 8/2007 | Bierslaker | |
| 2007/0264474 A1 | 11/2007 | Filipp | |
| 2010/0207295 A1* | 8/2010 | Goetz | B29C 45/1671 |
| | | | 264/272.11 |
| 2010/0330708 A1* | 12/2010 | Engel | G01D 5/147 |
| | | | 438/3 |
| 2012/0043131 A1 | 2/2012 | Christov | |

FOREIGN PATENT DOCUMENTS

| | | | |
|---|---|---|---|
| DE | 10155537 | 11/2002 | |
| DE | 102006008478 | 9/2007 | |
| DE | 102006008478 A1 * | 9/2007 | ....... B29C 45/14336 |
| DE | 102007036264 | 2/2009 | |
| DE | 102008005315 | 7/2009 | |
| DE | 102009008457 | 8/2010 | |
| DE | 102011080789 | 2/2012 | |
| EP | 2031356 | 3/2009 | |
| FR | 2897435 | 8/2007 | |
| WO | 03081260 | 10/2003 | |
| WO | 2010037810 | 4/2010 | |

OTHER PUBLICATIONS

International Search Report and Written Opinion of the International Searching Authority for International Application No. PCT/EP2014/071589 dated Dec. 23, 2014.

European Office Action for European Application No. 14 786 470.6, dated Apr. 12, 2017, including English translation, 8 pages.

* cited by examiner

TOOL FOR THE PRIMARY SHAPING OF A HOUSING FOR A SENSOR

CROSS REFERENCE TO RELATED APPLICATIONS

This application is the U.S. National Phase Application of PCT International Application No. PCT/EP2014/071589, filed Oct. 8, 2014, which claims priority to German Patent Application No. 10 2013 224 466.5, filed Nov. 28, 2013, the contents of such applications being incorporated by reference herein.

FIELD OF THE INVENTION

The invention relates to a tool for the primary shaping of a housing for a sensor, a method for using the tool and a sensor having a housing that is produced by means of the mentioned method.

BACKGROUND OF THE INVENTION

WO 2010/037 810 A1, which is incorporated by reference discloses housing a measuring element of a sensor in a housing by means of an injection molding method, said measuring element being configured so as to ascertain by way of the measuring element a physical field that is dependent upon a variable that is to be measured, and to output an electrical output signal based upon the physical field that is ascertained.

SUMMARY OF THE INVENTION

An aspect of the invention aims to improve the housing arrangement of the known sensor. In accordance with one aspect of the invention, a tool for the primary shaping of a housing for a sensor that is configured so as to ascertain by way of a measuring element a physical field that is dependent upon a variable that is to be measured, and said sensor is configured so as to output an electrical output signal based upon the physical field that is ascertained comprises a molding cavity for receiving a material, which forms the housing, and the measuring element, and a box having a wall that delimits the molding cavity, wherein at least one part of the wall that delimits the molding cavity is mounted in such a manner that it can be displaced. It is particularly preferred that the primary shaping method is a casting or injection molding method.

The underlying consideration of the tool that is disclosed is that it is necessary for the measuring element of the sensor to lie somewhere on the wall that delimits the molding cavity when being placed into the molding cavity since the measuring element cannot float in the molding cavity. However, at the position at which the measuring element lies on the wall that delimits the molding cavity, it is not possible however to injection mold or to cast the measuring element with the material that forms the housing, as a result of which the measuring element of the sensor remains uncovered at this site and is exposed to penetrating moisture. This reduces the serviceable life of the sensor.

In order to avoid the penetration of moisture, it is proposed within the scope of the present invention to embody at least one part of the wall that delimits the molding cavity in such a manner that said part can move. It is possible to place the measuring element on this movable wall in the molding cavity. If the measuring element is then injection molded with the material that forms the housing, it is possible to move the wall away from the measuring element, wherein the material that is to be injected or cast in the molding cavity holds the measuring element in place, said material being hardened or even already cured. It is then possible to cast further material in the resulting free space between the measuring element and the wall that has been moved away so that the finished housing does not have any remaining exposed sites, by way of which moisture could penetrate into the sensor.

In this manner, it is possible using the disclosed tool to significantly increase the serviceable life of the sensor by means of avoiding the penetration of moisture.

In a further development of the tool that is disclosed, the displaceable part of the wall is embodied as a slider that is mounted in such a manner that it can move with respect to the other part of the box. A slider of this type can be controlled in a simple manner in order to control the wall during the injection molding or casting procedure. It is possible for the control itself to be performed in an active or passive manner. The term "active control" means that an actuator is present and said actuator actively moves the wall away from the measuring element. In contrast, the term "passive control" means that the wall is moved away from the measuring element by means of the material that is injected into the molding cavity.

Various inlet or injecting ducts can be embodied on the tool and it is possible by way of said ducts to inject or introduce the material that forms the housing into the molding cavity. In this manner, it is possible to introduce the material for forming the housing by way of a first duct if the measuring element is still lying on the wall, wherein the material in the molding cavity hardens or even cures at the site of the further duct so that the movable wall can be moved by means of the material that is penetrating by way of the further duct.

In a particular further development of the tool that is disclosed, the slider is a sliding block. A sliding block of this type renders possible a technically simple production procedure and a simple installation in the tool that is disclosed.

In a particularly preferred further development of the tool that is disclosed, the molding cavity is configured so as to support the measuring element on the displaceable housing wall prior to introducing the material that forms the housing so that the movable wall can be moved away from said measuring element after introducing the material that forms the housing and said material at least in part hardening.

In accordance with a further aspect of the invention, a method for using one of the tools that are disclosed for producing the housing comprises the steps of placing the measuring element in the molding cavity, introducing the material into the molding cavity, moving the movable part of the wall and introducing a further material into the molding cavity when moving or after moving the movable part of the wall.

It is preferred that the material and the further material are identical. In this manner, the material and the further material can mix well with one another when injecting the further material so that no gaps occur between the individual material layers and the penetration of moisture into the housing is avoided in an optimal manner.

In a particular further development of the method that is disclosed, the material is a thermoplastic. A thermoplastic is a synthetic material that can deform in a specific temperature range. The procedure is reversible and can be repeated by means of cooling and reheating in an arbitrary manner. This uses the further development of the method that is disclosed in that by means of injecting the further material that is embodied as a thermoplastic onto the already cured or hardened first material at least one upper layer of the first material is reheated and liquefied, whereby the mixing of the two materials is further encouraged on its boundary layer.

In a particularly preferred further development of the method that is disclosed, the further material comprises a thermal energy when being introduced into the molding cavity, and the previously introduced material is at least in part melted using the thermal energy of the further material so that an optimal mixture of the two materials is provided at the boundary layer.

In accordance with a further aspect of the invention, a sensor for ascertaining by way of a measuring element a physical field that is dependent upon a variable that is to be measured and for outputting an electrical output signal based upon the physical field that is ascertained comprises a housing that is produced by means of one of the disclosed methods.

BRIEF DESCRIPTION OF THE DRAWINGS

The above described characteristics, features and advantages of this invention and also the manner in which these are achieved are further explained in a clearer and understandable manner in conjunction with the description hereinunder of the exemplary embodiments that are further explained in conjunction with the drawings, wherein.

DETAILED DESCRIPTION OF THE PREFERRED EMBODIMENTS

Figure 1:
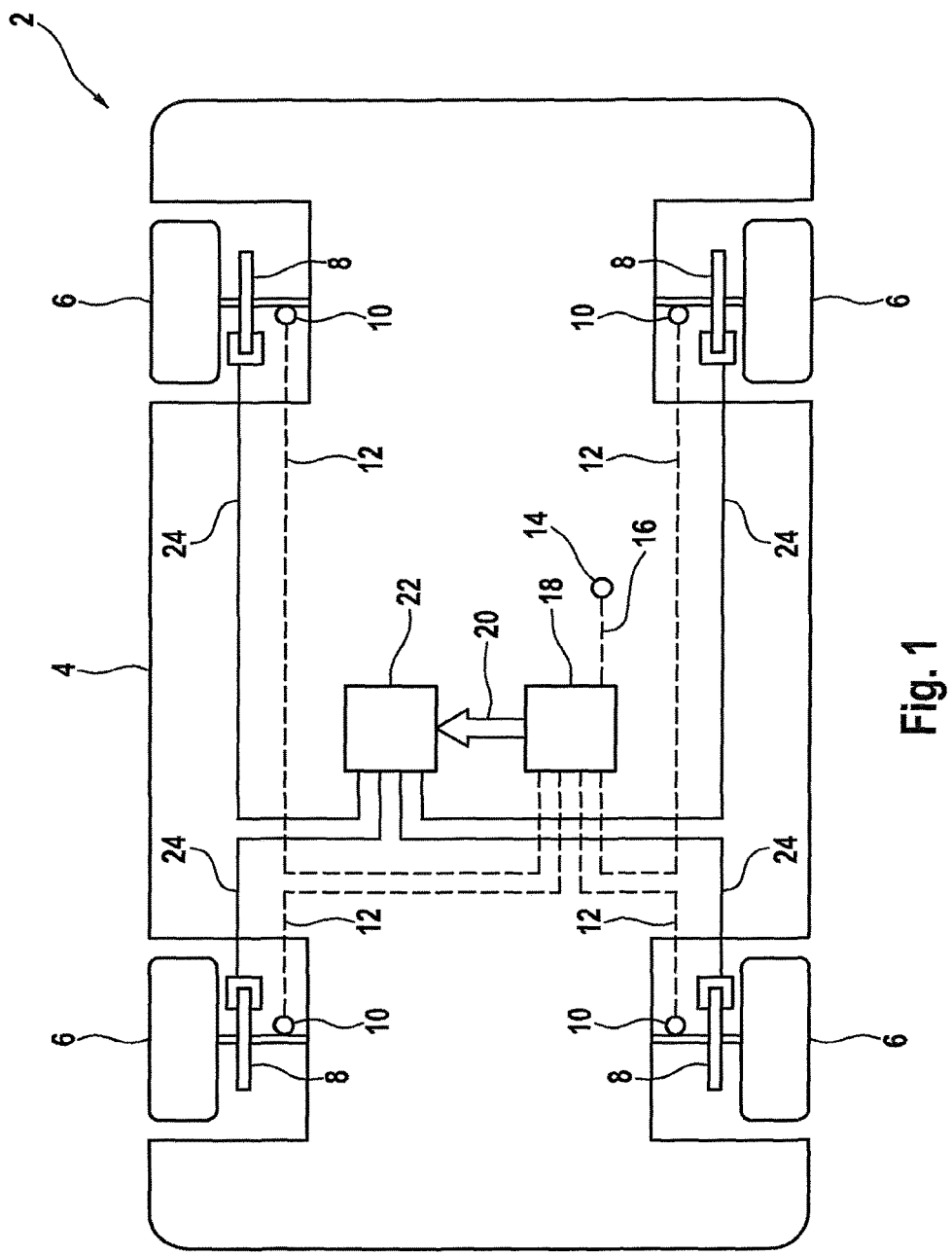
FIG. 1 illustrates a schematic view of a vehicle having a driving dynamics control system.

In the figures, identical technical elements are provided with identical reference numerals and are only described once.

Reference is made to FIG. 1 that illustrates a schematic view of a vehicle 2 having a known driving dynamics control system. Details of this driving dynamics control system can be found by way of example in DE 10 2011 080 789 A1, which is incorporated by reference.

The vehicle 2 comprises a chassis 4 and four wheels 6. Each wheel 6 can be slowed down with respect to the chassis 4 by way of a brake 8 that is immovably fastened to the chassis 4 in order to slow down a movement of the vehicle 2 on a road that is not further illustrated.

It is possible in a manner that is known to the person skilled in the art for the wheels 6 of the vehicle 2 to lose traction and for the vehicle 2 to be moved from a trajectory, which is predetermined by way of example by way of a steering wheel that is not further illustrated, as a result of understeer or oversteer. This is avoided by means of control circuits known per se, such as ABS (anti-lock brake system) and ESP (electronic stability program).

In the present embodiment, the vehicle 2 comprises for this purpose rotational speed sensors 10 on the wheels 6, said rotational speed sensors ascertaining a rotational speed 12 of the wheels 6. In addition, the vehicle 2 comprises an inertial sensor 14 that ascertains the driving dynamics data 16 of the vehicle 2 from which by way of example it is possible to output a pitch rate, roll rate, a yaw rate, a lateral acceleration, a longitudinal acceleration and/or a vertical acceleration in a manner that is known to the person skilled in the art.

Based upon the ascertained rotational speeds 12 and driving dynamics data 16, it is possible for a regulator 18 to determine in a manner known to the person skilled in the art whether the vehicle 2 is slipping on the roadway or even if said vehicle is deviating from the above mentioned predetermined trajectory and accordingly to react thereto using a regulator output signal 20 known per se. The regulator output signal 20 can then be used by an adjusting device 22 in order to control adjusting members such as the brakes 8 by means of adjusting signals 24, said brakes reacting to the slipping and the deviation from the predetermined trajectory in a known manner.

The regulator 18 can be integrated into a motor control known per se of the vehicle 2. It is also possible for the regulator 18 and the adjusting device 22 to be embodied as a common regulating device and optionally to be integrated into the above mentioned motor control.

The present invention is to be further clarified with reference to the wheel rotational sensor 10 that is illustrated in FIG. 1 even if the present invention is feasible in arbitrary electronic apparatus and in particular in arbitrary sensors such as magnetic field sensors, acceleration sensors, rotational speed sensors, structure-borne sound sensors or temperature sensors.

Figure 2:
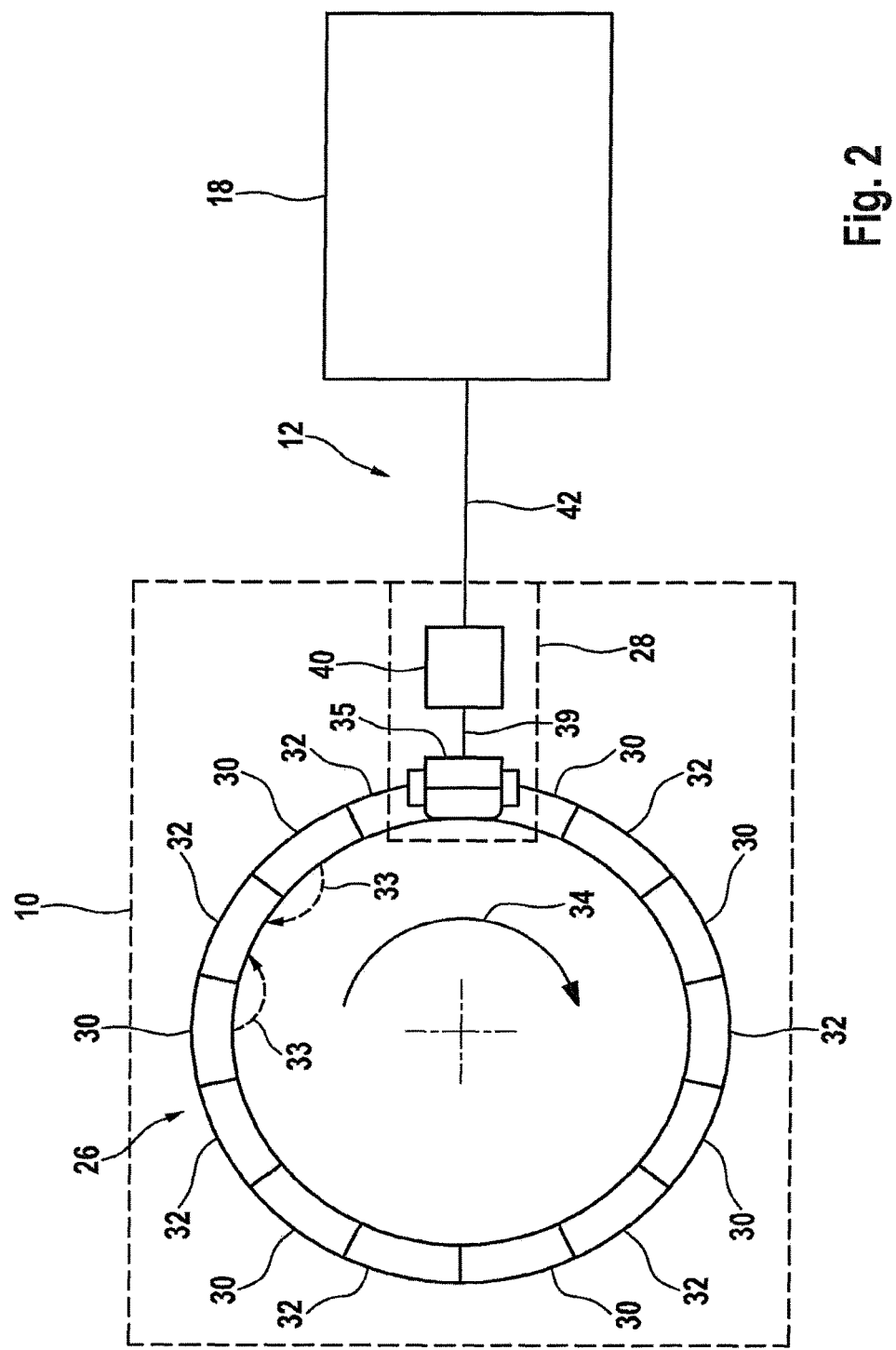
FIG. 2 illustrates schematically a rotational speed sensor in the vehicle from FIG. 1.

Reference is made to FIG. 2 that illustrates a schematic view of the rotational speed sensors 10 in the driving dynamics regulating procedure in FIG. 1.

In the present embodiment, the rotational speed sensor 10 is embodied as an active rotational speed sensor that comprises a sensor element in the form of an encoder disc 26 that is fastened to the wheel 6 in a non-rotatable manner and a sensor circuit that is immovably fastened to the chassis 4, said sensor circuit being referred to hereinunder as reading head 28 for the sake of clarity.

In the present embodiment, the encoder disc 26 is embodied from magnetic north poles 30 that are arranged in a row together and magnetic south poles 32 that together excite a physical field in the form of a sensor magnetic field 33. This sensor magnetic field is indicated in FIG. 2 for the sake of clarity by two dashed field lines. If the encoder disc 26 that is fastened to the wheel 6 rotates with said wheel in a direction of rotation 34, the sensor magnetic field thus rotates with said wheel and encoder disc.

In the present embodiment, the reading head 28 comprises a probe in the form of a magnetostrictive element 35. The magnetostrictive element 35 changes its electrical resistance in dependence upon the angular position of the sensor magnetic field that is excited by the encoder wheel 26. A test signal 39 is applied to the magnetostrictive element 35 so as to ascertain the rotational speed 12, said test signal being altered in dependence upon the angular position of the encoder wheel 26 and thereby the electrical resistance magnetostrictive element 35. Based upon this alteration of the test signal 39, a signal evaluating circuit 40 evaluates the rotational speed 12 and outputs said rotational speed in a data signal 42 to the regulator 18. This signal evaluating circuit 40 can likewise be part of the reading head 28.

For this purpose and for further background information regarding active wheel rotational speed sensors, reference is made to the relevant prior art, such as by way of example DE 101 46 949 A1, which is incorporated by reference.

Figure 3:
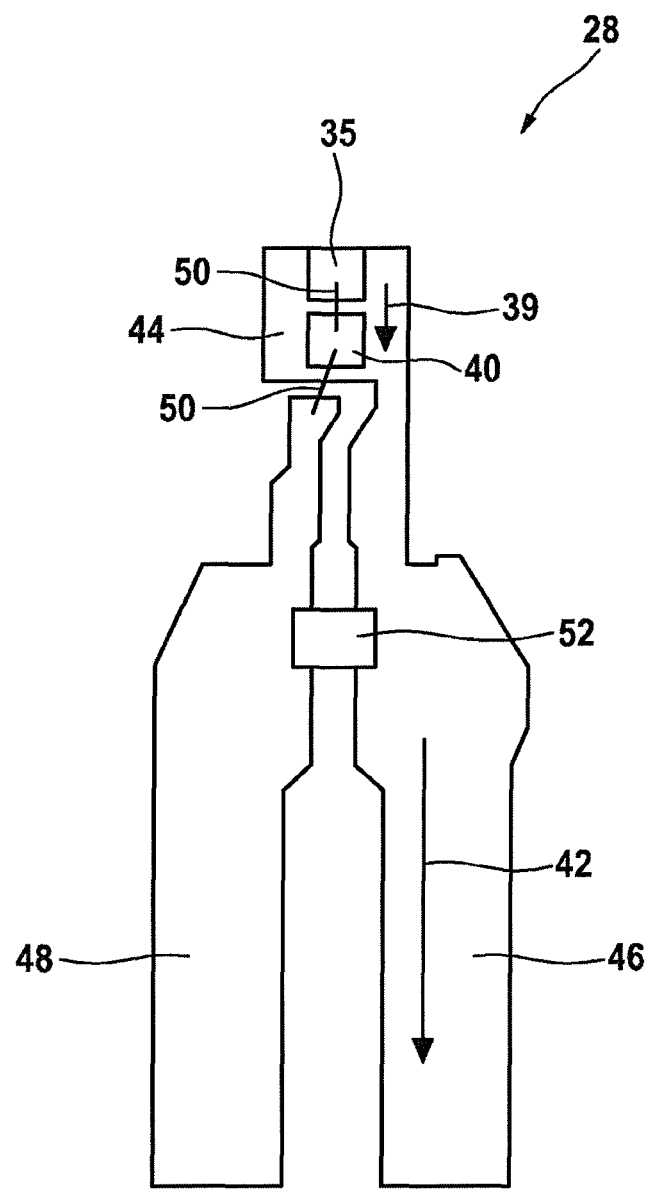
FIG. 3 illustrates schematically a reading head of the rotational speed sensor from FIG. 2 in a mid-production state.

Reference is made to FIG. 3 that illustrates schematically the reading head 28 for the rotational speed sensor 10.

In the present embodiment, the reading head 28 is connected to a wiring carrier in the form of a lead frame, the term "Leadframe" is also used for this. A lead frame of this type is disclosed by way of example in WO 2010/037 810 A1. The reading head 28 is illustrated in FIG. 3 in a state that is punched out from the lead frame. Therefore, in FIG. 3 only a populating island 44, a first contact connection 46 that is connected in a single part manner to the populating island 44, and a second contact connection 48 that is separated from the populating island 44 are visible.

The probe in the form of a magnetostrictive element 35 and the signal evaluating circuit 40 are attached to the populating island 44 and are electrically contacted by way of example by means of solder or adhesive. The magnetostrictive element 35 and the signal evaluating circuit 40 are in addition connected to one another by way of a bond wire 50 so that it is possible to transmit the test signal 39 by way of the populating island 44 and the bond wire 50 between the magnetostrictive element 35 and the signal evaluating circuit 40. The signal evaluating circuit 40 is connected by way of a further bond wire 50 to the second contact connector 48. In this manner, the data signal 42 can be output from the signal evaluating circuit 40 by way of the two contact connectors 46, 48. A filter capacitor 52 can be connected between the contact connectors 46, 48.

Figure 4:
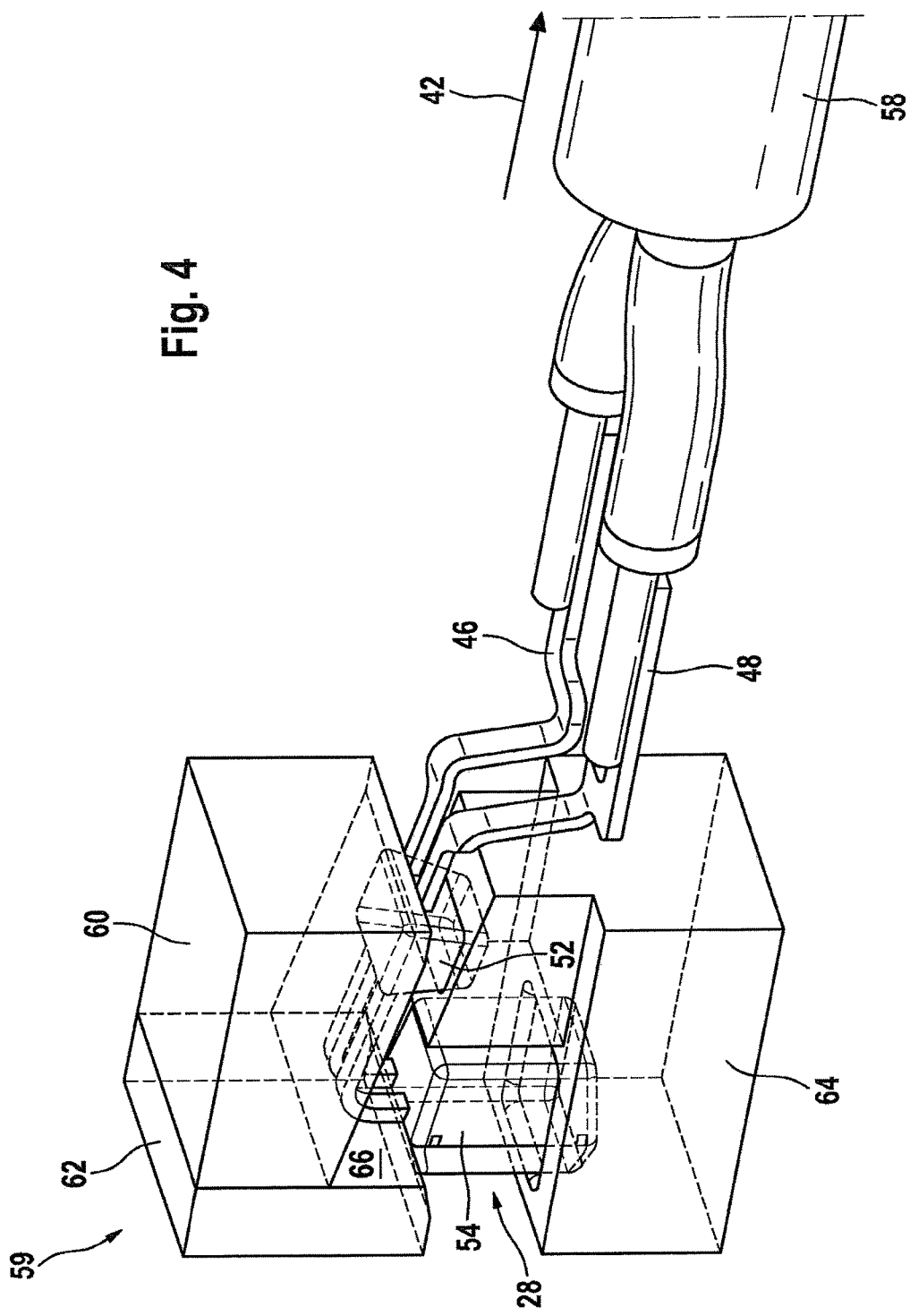
FIG. 4 illustrates schematically an arrangement of the reading head from FIG. 3 in a tool for forming a housing around the reading head.

A protective layer 54 can be embodied around the populating island 44 which supports the reading head 28, and a part of the contact connectors 46, 48 so as to protect the reading head 28, said protective layer being visible in FIG. 4. For this purpose, for the sake of brevity reference is made to the relevant prior art, such as by way of example WO 2010/037 810 A.

The reading head 28 is housed in a housing 56 that is illustrated in the FIGS. 5 to 8 so as to protect the reading head 28 against penetrating moisture or other contaminants.

For this purpose, the reading head 28 is initially electrically connected to a data cable 58 that transmits the data signal 42 to the regulator.

The reading head 28 is subsequently bent into a suitable shape for the end application. Since this shape is no longer of significance within the scope of the invention, the reason being that said shape is arbitrary, the shape for the reading head 28 that is illustrated in FIG. 4 is only to be referred to hereinunder in an exemplary manner.

The finished bent reading head 28 is finally placed in a tool 59 for the primary shaping of the housing 56. This tool 59 is constructed within the scope of the present embodiment in a multiple part manner from an immovable tool part, a first movable tool part 60, a second movable tool part 62 and a third movable tool part 64. In order to be able to better illustrate the movable tool parts 60 to 64, the illustration of the immovable tool part is omitted.

Figure 6:
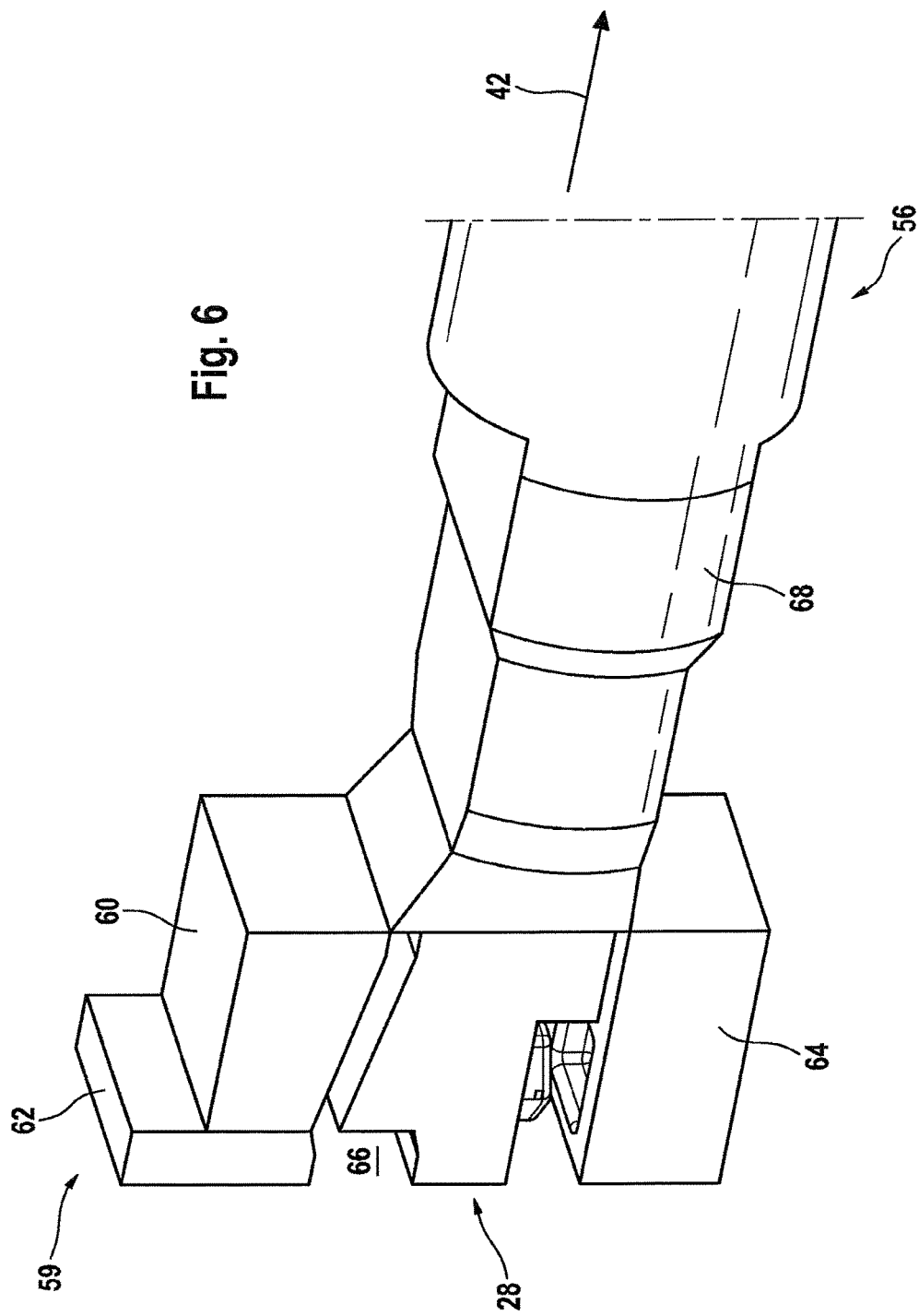
FIG. 6 illustrates schematically the arrangement from FIG. 4 in a further mid-production state of the housing.
Figure 7:
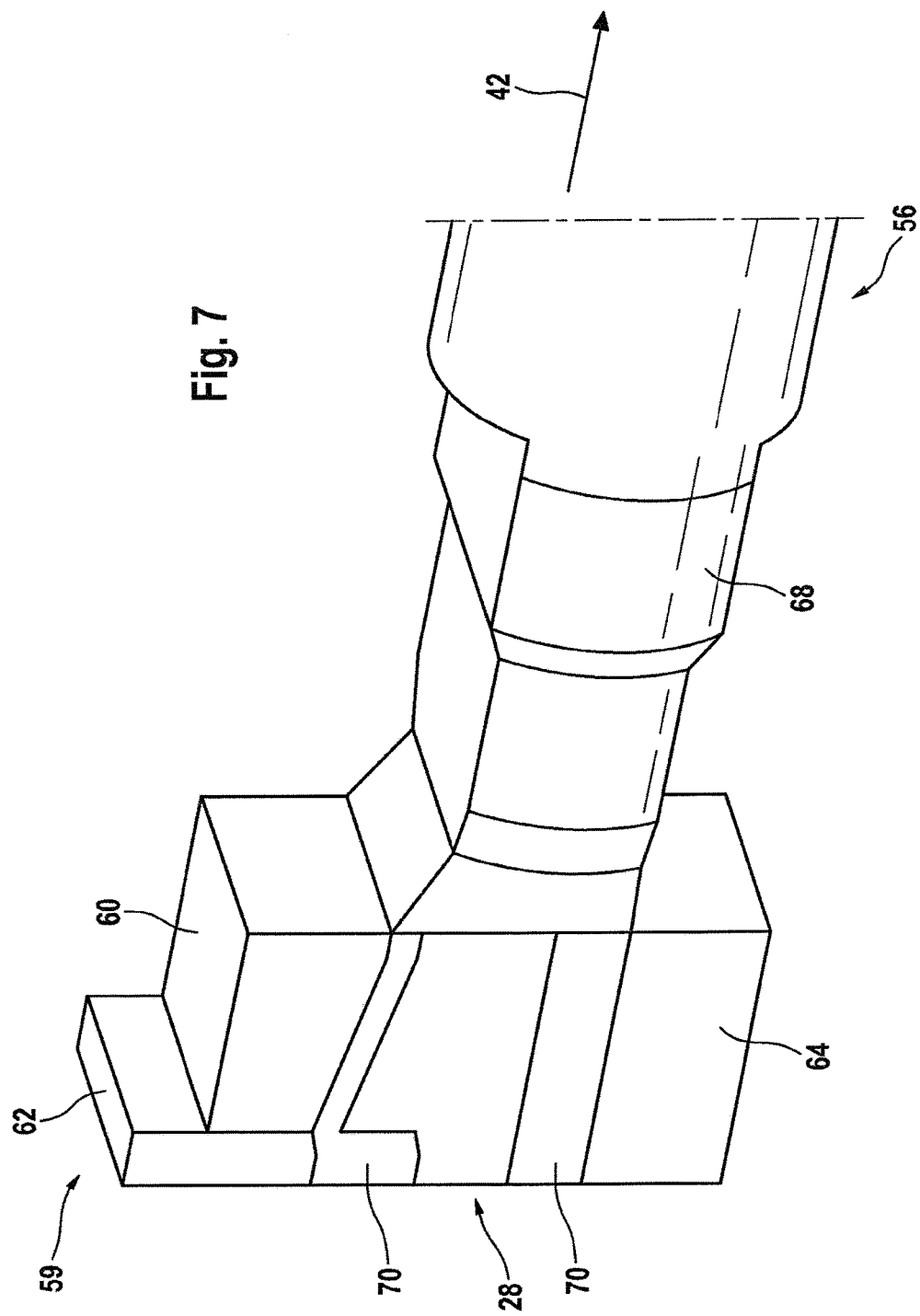
FIG. 7 illustrates schematically the arrangement from FIG. 4 in a further mid-production state of the housing and FIG. 8 illustrates schematically the reading head from FIG. 3 in the finished housing.

The immovable tool part and the movable tool parts 60 to 64 together form a box having a molding cavity 66 and the reading head 28 and a part of the data cable 58 are received in said molding cavity. Apart from the inlet openings, not further illustrated, that lead through the box, the molding cavity 66 is embodied in a sealed manner for supplying the material 68, 70 that is illustrated in FIGS. 5 to 7 so as to form the housing 56, wherein the movable tool parts 60 to 64 are arranged in such a manner that they can move with respect to the immovable tool part and thus can form a movable wall for the molding cavity 66 and thereby can alter the dimensions of the molding cavity 66.

The movable tool parts 60 to 64 can be embodied in an arbitrary manner. Within the scope of the present embodiment, the movable tool parts 60 to 64 are sliding blocks that can move and are received in a guided manner in the immovable tool part.

The procedure of embodying the housing 56 by means of introducing a material into the molding cavity 66 within the scope of an injection molding method is to be further explained hereinunder.

Figure 5:
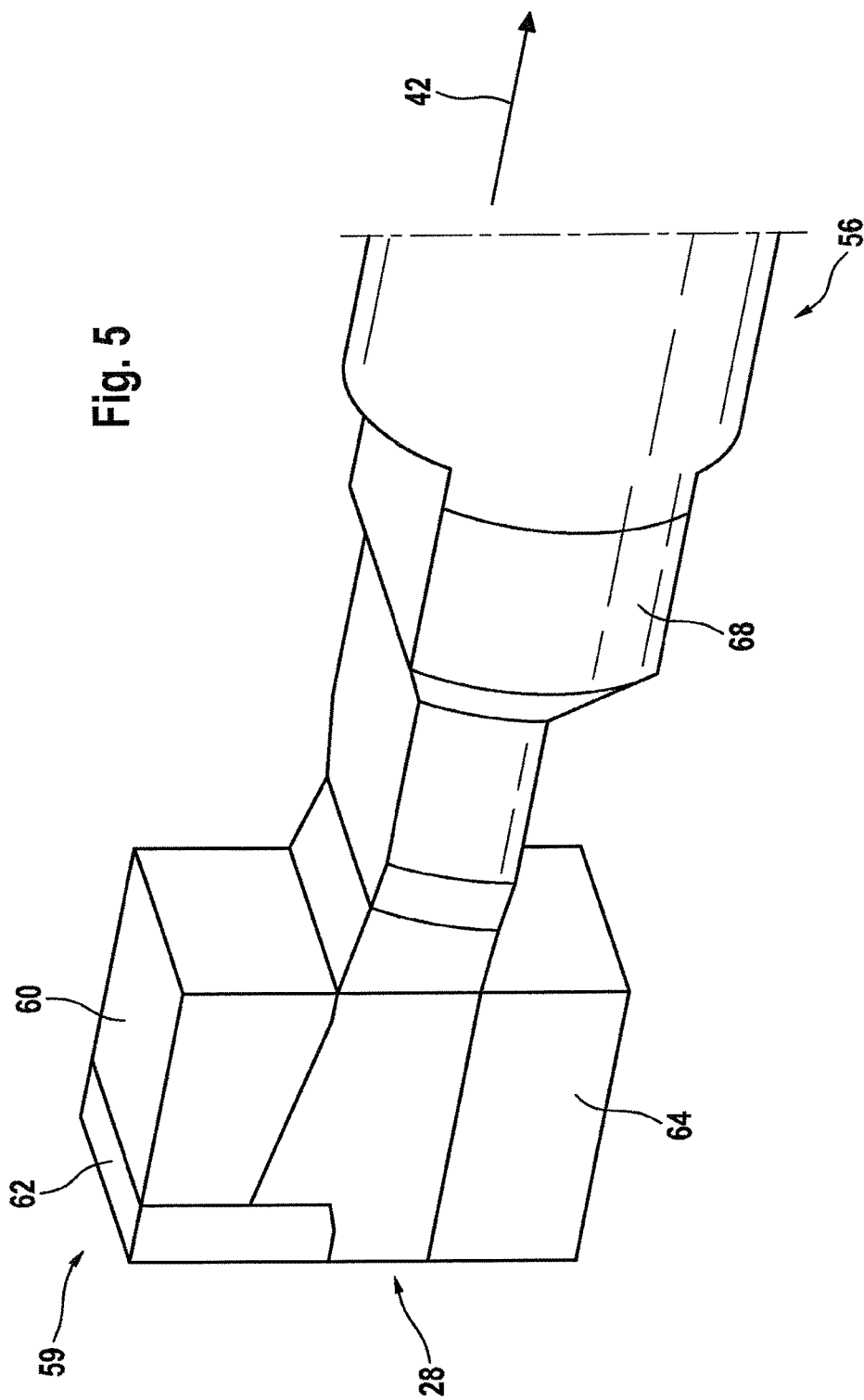
FIG. 5 illustrates schematically the arrangement from FIG. 4 in a mid-production state of the housing.

For this purpose, initially as is illustrated in FIG. 5, a first material 68 is introduced into the molding cavity 66 by means of injection molding. The first material 68 is introduced, as is previously mentioned, by way of inlet openings into the molding cavity 66 and said inlet openings are not further illustrated.

After introducing the first material 68 into the molding cavity 66 in the state that is illustrated in FIGS. 4 and 5 of the movable tool parts 60 to 64, the movable tool parts 60 to 64 are displaced as is illustrated in FIG. 6. This is expediently performed in an at least in part hardened state of the first material 68 and the in part hardened housing can thereby be held by the immovable tool part, not illustrated. The molding cavity 66 is enlarged in the region of the reading head 28 by means of displacing the movable tool parts 60 to 64.

The second material 70 is injection molded into this newly produced region of the molding cavity 66, as is illustrated in FIG. 7. In this manner, an absolutely sealed housing 56 is produced in the region of the reading head 28, wherein however simultaneously the magnetostrictive element 35 is positioned in a highly precise manner within the housing 56.

Figure 8:
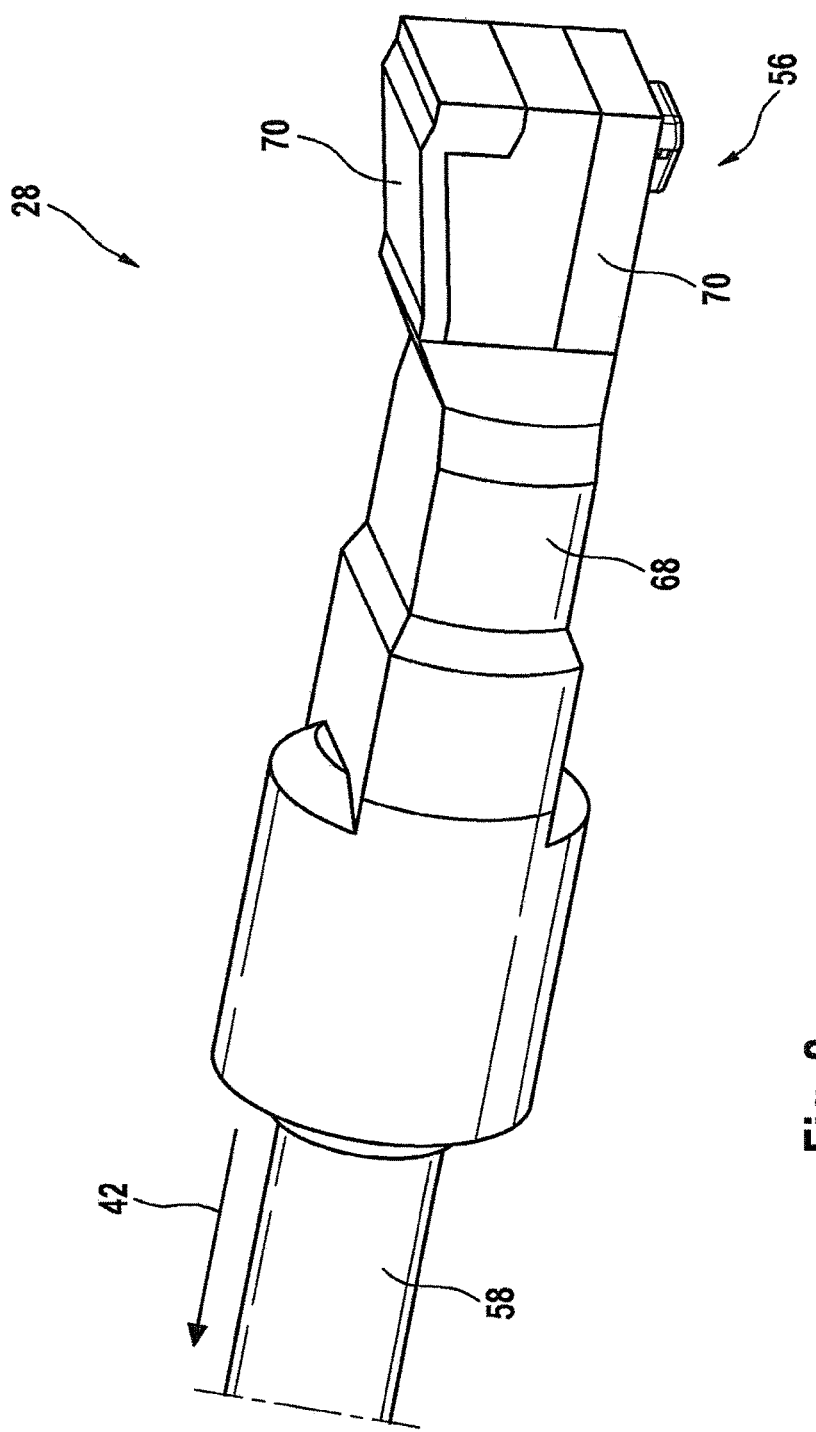

The reading head 28 in the finished housing is finally illustrated in FIG. 8.

The invention claimed is:

1. A method for using a tool for producing a housing for a sensor that is configured so as to ascertain by way of a measuring element a physical field that is dependent upon a variable that is to be measured and to output an electrical output signal based upon the physical field that is ascertained, the tool comprising a molding cavity for receiving a material that forms the housing and the measuring element, and a box having a wall that delimits the molding cavity, at least one part of the wall that delimits the molding cavity being mounted in such a manner that it can be displaced, the method comprising:
   placing the measuring element in the molding cavity,
   introducing the material into the molding cavity,
   moving the movable part of the wall, and
   introducing a further material into the molding cavity during or after moving the movable part of the wall, the further material being identical to the material, the further material comprising a thermal energy when being introduced into the molding cavity, the material being at least in part melted by the thermal energy of the further material.

2. The method as claimed in claim 1, wherein the displaceable part of the wall is embodied as a slider that is mounted in such a manner that it can move with respect to another part of the box.

3. The method as claimed in claim 2, wherein the slider is a sliding block.

4. The method as claimed in claim 1, wherein the molding cavity is configured so as to support the measuring element on the displaceable wall prior to introducing the material that forms the housing.

5. The method as claimed in claim 1, wherein the material is a thermoplastic.

6. A sensor for ascertaining by way of a measuring element a physical field that is dependent upon a variable that is to be measured and for outputting an electrical output signal based upon the physical field that is ascertained comprising a housing that is produced by the method in accordance with claim 1.

* * * * *